United States Patent
Somers et al.

(10) Patent No.: US 12,176,700 B2
(45) Date of Patent: Dec. 24, 2024

(54) PHOTOVOLTAIC RAPID SHUTDOWN AND ARC SENSING SYSTEM

(71) Applicant: DCBEL INC., Montréal (CA)

(72) Inventors: Cedric Somers, Saint-Amable (CA); Marc-André Forget, Saint-Lazare (CA)

( * ) Notice: Subject to any disclaimer, the term of this patent is extended or adjusted under 35 U.S.C. 154(b) by 0 days.

(21) Appl. No.: 18/422,619

(22) Filed: Jan. 25, 2024

(65) Prior Publication Data
US 2024/0162700 A1    May 16, 2024

Related U.S. Application Data

(60) Division of application No. 18/458,091, filed on Aug. 29, 2023, now Pat. No. 11,923,671, which is a continuation of application No. PCT/CA2023/050491, filed on Apr. 11, 2023.

(60) Provisional application No. 63/348,284, filed on Jun. 2, 2022, provisional application No. 63/347,293, filed on May 31, 2022, provisional application No. 63/329,169, filed on Apr. 8, 2022.

(51) Int. Cl.
*H02H 1/00* (2006.01)
*H02H 3/02* (2006.01)
*H02S 50/10* (2014.01)

(52) U.S. Cl.
CPC ......... *H02H 1/0015* (2013.01); *H02H 3/025* (2013.01); *H02S 50/10* (2014.12)

(58) Field of Classification Search
CPC ........ H02H 1/0015; H02H 3/025; H02H 3/50; H02H 7/205; H02H 1/0076; H02H 3/05; H02S 50/10; H02S 40/30; H02S 50/00; H01L 31/02021; G01R 31/1227

USPC .......................................................... 361/42
See application file for complete search history.

(56) References Cited

U.S. PATENT DOCUMENTS

| | | | |
|---|---|---|---|
| 3,646,294 A | 2/1972 | McCloud | |
| 4,935,715 A | 6/1990 | Popeck | |
| 5,162,967 A | 11/1992 | Ojanguren Torrontegui | |
| 5,172,090 A | 12/1992 | Ranjan et al. | |
| 5,612,661 A | 3/1997 | Twenter et al. | |
| 6,388,849 B1 | 5/2002 | Rae | |
| 8,334,738 B2 | 12/2012 | Smith et al. | |
| 10,044,184 B1 | 8/2018 | You et al. | |
| 11,323,786 B2 * | 5/2022 | Collin ..................... H04Q 9/14 | |
| 11,451,052 B2 | 9/2022 | Au et al. | |

(Continued)

FOREIGN PATENT DOCUMENTS

CN    111555710 A    8/2020
WO    2013/169716 A1    11/2013
(Continued)

OTHER PUBLICATIONS

International application No. PCT/CA2023/050491 International Search Report dated Aug. 1, 2023.

(Continued)

*Primary Examiner* — Dharti H Patel
(74) *Attorney, Agent, or Firm* — Anglehart et al.

(57) ABSTRACT

The present disclosure provides a system, apparatus and method for providing rapid shutdown for photovoltaic power systems and provides a system, apparatus and method for providing arc sensing for photovoltaic power systems. An AC current can be put on the DC bus to control PV panel shutdown. Local mean decomposition can be used to sense arcing on the DC bus.

10 Claims, 16 Drawing Sheets

(56) References Cited

U.S. PATENT DOCUMENTS

| | | | |
|---|---|---|---|
| 11,769,995 B2 * | 9/2023 | Dichler | G01R 31/14 702/58 |
| 2005/0104709 A1 | 5/2005 | Montante | |
| 2009/0212898 A1 | 8/2009 | Montante et al. | |
| 2013/0094112 A1 * | 4/2013 | Burghardt | H01L 31/02021 361/42 |
| 2014/0070833 A1 | 3/2014 | Luebke et al. | |
| 2014/0301003 A1 | 10/2014 | Jankowski | |
| 2015/0116878 A1 | 4/2015 | Richard et al. | |
| 2017/0150241 A1 * | 5/2017 | Collin | H04Q 9/14 |
| 2018/0013292 A1 * | 1/2018 | White | H04B 3/54 |
| 2019/0089148 A1 | 3/2019 | Hopf | |
| 2021/0006067 A1 * | 1/2021 | Donahue | H02J 3/388 |
| 2023/0253776 A9 * | 8/2023 | Gloes | H02H 1/0015 361/54 |
| 2023/0283080 A1 * | 9/2023 | Chen | H02J 3/381 700/276 |
| 2024/0204687 A1 | 6/2024 | Pahlevaninezhad et al. | |

FOREIGN PATENT DOCUMENTS

| | | | |
|---|---|---|---|
| WO | WO-2018146556 A1 * | 8/2018 | H02J 3/383 |
| WO | 2022/175770 A1 | 8/2022 | |

OTHER PUBLICATIONS

International application No. PCT/CA2023/050491 Written Opinion of the International Searching Authority dated Aug. 1, 2023.
Corresponding U.S. Appl. No. 18/422,579 Notice of allowance dated Aug. 14, 2024.
International application No. PCT/CA2023/050491 Supplementary International Search Report dated Jul. 26, 2024.

* cited by examiner

PHOTOVOLTAIC RAPID SHUTDOWN AND ARC SENSING SYSTEM

CROSS-REFERENCES TO OTHER RELATED PATENT APPLICATIONS

This application a divisional patent application of U.S. patent application Ser. No. 18/458,091 filed Aug. 29, 2023, now allowed, that is a continuation of PCT/CA2023/050491 filed Apr. 11, 2023, designating the United States, that claims priority from U.S. provisional patent applications 63/329,169 filed Apr. 8, 2022; 63/347,293 filed May 31, 2022; and 63/348,284 filed Jun. 2, 2022 the content of which is hereby incorporated by reference.

TECHNICAL FIELD

The present document relates to solar power safety features and more specifically to a safety system for photovoltaic panels.

BACKGROUND

This section is intended to provide a background or context to the invention that is recited in the claims. The description herein may include concepts that could be pursued, but are not necessarily ones that have been previously conceived or pursued. Therefore, unless otherwise indicated herein, what is described in this section is not prior art to the description and claims in this application and is not admitted to be prior art by inclusion in this section.

Poor electrical connections in high voltage systems, such as solar panel buses, can lead to electric arcs forming at bad or poor contact or connection points. Such arcing can lead to electrical circuit damage and/or fire.

In the United States, a safety standard (UL 1741) has been established for photovoltaic (PV) systems that includes providing a rapid shutdown system (PVRSS) and an American National Standard (ANSI/UL 1699) has been established for Arc-Fault Circuit Interrupters (AFCIs). The standard requires that a PV system should not provide more than 30V in 30 s outside of the PV boundaries and 80V within the boundaries when in protection mode. The protection mode can typically be engaged using a safety switch on the outside of a building, for example when firefighters or roof repair workers plan to access a roof of a building having a PV system installed thereon.

Known PVRSS systems involve providing signal transmission between the protection mode controller and electronic controllers responsive to the signal transmission to control switches to disconnect PV panels. When the sun shines, each PV panel will produce a low DC voltage, and panels are connected in series to a power bus to reduce the current levels in the power bus. The result of a number of panels connected together in series is a voltage much greater than 80V, and so there is a need to provide disconnect switches at multiple locations in the PV string of panels, if not at each PV panel. The cost of providing reliable electronic controllers responsive to the signal transmission to control switches to disconnect PV panels is a problem.

Additionally, arc detection in photovoltaic (PV) systems is a requirement for future solar designs due to new dangers, especially fires, which can occur in PV solar panel installations.

Furthermore, to prevent the risk of fire or damage that would cause a permanent open circuit, there is a need to detect arcing as soon as it starts and to open the PV circuit so that arcing stops. Opening the PV circuit based on arc sensing typically involves including separately controlled switches adding to the cost of PV system.

SUMMARY

Applicant has found that arc sensing circuitry can be isolated from the PV DC bus using a transformer that is shared with passive circuitry connected to the PV power bus can be driven remotely using an AC power source with the passive circuitry providing gate signals to normally open switches connecting PV panels to the bus. In this way, arc sensing is not affected by the AC power source and shutdown of the AC power source can cause the normally open switches to open, thus disconnecting the PV panels from the bus so as to comply with safety requirements.

In one broad aspect, the present disclosure provides an isolation switch device for a photovoltaic (PV) panel which comprises an AC coupler and a bandpass filter connected in series between an input and an output of the device; a rectifier gate signal circuit connected to the AC coupler and providing a switch gate signal; and at least one normally open switch connected in parallel to the bandpass filter, a gate of the at least one normally open switch being connected to the switch gate signal.

In some embodiments, the bandpass filter of the isolation switch may be operative to pass an AC current within a range of 200 kHz and 300 kHz.

In one embodiment, the AC coupler of the isolation switch may be a transformer. In some examples of the present disclosure the normally open switch comprises a pair of normally open switches connected in parallel to the bandpass filter.

In one broad aspect, the present disclosure provides a photovoltaic (PV) rapid shutdown system. The system comprises an AC power supply providing an AC current; an AC injector for coupling the AC current to a DC bus of a PV panel array; a shutdown control input associated with one of the AC power supply and the AC injector for interrupting supply of the AC current to the DC bus; and at least one isolation switch device as defined in different variants throughout this application.

In one broad aspect the present disclosure provides a photovoltaic (PV) rapid shutdown and arc-sensing system comprising: an AC power supply providing an AC current; an arc-sensing circuit having an output indicating arcing; an AC injector transformer for coupling the AC current to a DC bus of a PV panel array, the AC injector transformer having a first winding connected to the AC power supply, a second winding connected to the DC bus, and a third winding connected to the arc sensing circuit and having a direction of turns opposite a direction of turns of the first winding; a shutdown control input associated with one of the AC power supply and the AC injector for interrupting supply of the AC current to the DC bus, the shutdown control input being connected to the output of the arc-sensing circuit; and at least one isolation switch device comprising an AC coupler and a bandpass filter connected in series between an input and an output of the device, a rectifier gate signal circuit connected to the AC coupler and providing a switch gate signal, and at least one normally open switch connected in parallel to the bandpass filter, a gate of the at least one normally open switch being connected to the switch gate signal.

In some embodiments, the rapid shutdown system may have PV panel array connected to the DC bus, the AC power supply providing less than 20 mW per meter of the DC bus in the PV panel array.

In one other broad aspect, the present disclosure provides a method for providing emergency de-energizing of a photovoltaic panel. The method comprises injecting AC current over a DC bus of a PV panel array; isolating the AC current from the DC bus; and using the isolated AC current to cause a passive circuitry to allow flow of DC current from the PV panels over the DC bus, wherein an interruption of the AC provides the emergency de-energizing of the DC bus.

In some examples, the using the isolated AC current to power a passive circuitry to allow flow of DC current from the PV panels over the DC bus may comprise receiving the isolated AC current by a rectifier gate signal circuit providing a switch gate signal; and closing at least one normally open switch using the switch gate signal to allow flow of DC current from the PV panels over the DC bus; wherein upon interruption of the AC current the at least one normally open switch opens and stops flow of DC current over the DC bus.

In some examples of the method, the isolating the AC current from the DC bus comprises using a transformer to isolate the AC current.

In some examples of the method, the injecting AC current over a DC bus of a PV panel array comprises injecting the AC current at a frequency different from a working of an inverter receiving the DC voltage.

In another broad aspect, the present disclosure provides a photovoltaic (PV) rapid shutdown and arc-sensing system comprising: an AC power supply providing an AC current; an arc-sensing circuit having an output indicating arcing; an AC injector transformer for coupling the AC current to a DC bus of a PV panel array, the AC injector transformer having a first winding connected to the AC power supply, a second winding connected to the DC bus, and a third winding connected to the arc sensing circuit and having a direction of turns opposite a direction of turns of the first winding; a shutdown control input associated with one of the AC power supply and the AC injector for interrupting supply of the AC current to the DC bus, the shutdown control input being connected to the output of the arc-sensing circuit; and at least one isolation switch device comprising an AC coupler and a bandpass filter connected in series between an input and an output of the device, a rectifier gate signal circuit connected to the AC coupler and providing a switch gate signal, and at least one normally open switch connected in parallel to the bandpass filter, a gate of the at least one normally open switch being connected to the switch gate signal.

In yet another broad aspect, the present disclosure provides a method for detecting an arc in a photovoltaic system. The method includes collecting a raw signal by a sensor connected to a DC bus of the photovoltaic system; applying threshold Local Mean Decomposition (LMD) to extract a first set of peaks and valleys from the raw signal; finding a first set of envelopes using the first set of peaks and valleys; applying Windowed Local Mean Decomposition (LMD) to extract a second set of peaks and valleys; finding a second set of envelopes using the second set of peaks and valleys; comparing the first set of envelopes and the second set of envelopes; and sending an output signal indicating arcing when the first set of envelopes and the second set of envelopes concurrently shown an arc in the system. When the output signal indicates arcing, current in the DC bus can be interrupted or a PV panel can be by-passed with a view to eliminate the arcing problem.

It will be appreciated that the sensor may be any type of sensor used for detecting arcs including sensors used for detecting voltage and current n the DC bus.

In some examples of the present method, the sending an output indicating arcing when the first set of envelopes and the second set of envelopes concurrently shown an arc in the system comprises applying blanking method to the first set of envelopes and the second set of envelopes.

In one example of the present method, the sending an output indicating arcing when the first set of envelopes and the second set of envelopes concurrently shown an arc in the system comprises applying leaky bucket method to the first set of envelopes and the second set of envelopes.

In some examples, the method further comprising applying mean subtraction to the first set of envelopes and the second set of envelopes.

In some examples of the present method the shutting down the photovoltaic system upon sending the output signal indicating arcing.

In another broad aspect the present disclosure provides an arc-sensing circuit for use with a photovoltaic system comprising a sensor connected to a DC bus of the photovoltaic system collecting raw signal from the DC bus; a control unit receiving the raw signal comprising: a processor; and a non-transitory computer-readable medium containing instruction that, when executed by the processor, causes the processor to perform applying threshold Local Mean Decomposition (LMD) to extract a first set of peaks and valleys from the raw signal; finding a first set of envelopes using the first set of peaks and valleys; applying Windowed Local Mean Decomposition (LMD) to extract a second set of peaks and valleys; finding a second set of envelopes using the second set of peaks and valleys; comparing the first set of envelopes and the second set of envelopes; and sending an output signal indicating arcing when the first set of envelopes and the second set of envelopes concurrently shown an arc in the system.

BRIEF DESCRIPTION OF THE DRAWINGS

The invention will be better understood by way of the following detailed description of embodiments of the invention with reference to the appended drawings, in which.

DETAILED DESCRIPTION

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Moreover, the described features, structures, or characteristics of the invention may be combined in any suitable manner in one or more embodiments. It will be apparent to those skilled in the art that various modifications and variations can be made to the present invention without departing from the scope of the invention. Thus, it is intended that the present invention cover the modifications and variations of this invention provided they come within the scope of the appended claims and their equivalents. Reference will now be made in detail to the preferred embodiments of the invention.

Rapid shutdown was first introduced in the 2014 National Electrical Code (NEC) with the intent of providing a simple method for fire fighters to de-energize solar system DC conductors easily to ensure a safe condition on the roof of a building during a fire. This is because on a standard string inverter solar system, when the inverter is switched off, the DC wiring from the solar system remains live when the sun is shining.

In the 2017 NEC, rapid shutdown was expanded with different requirements based on how close the PV system conductors are to the PV array boundary, which is now defined as the area 1 foot (305 mm) from the array in all directions.

PV circuits located outside the boundary or more than 3 feet (1 m) from the point of entry inside a building shall be limited to not more than 30 volts within 30 seconds of rapid shutdown initiation.

For PV circuits located inside the array boundary, one of the following three options must be used beginning with an effective date of 1 Jan. 2019:

The PV array shall be listed or field labeled as a rapid shutdown PV array. Such a PV array shall be installed and used in accordance with the instructions included with the rapid shutdown PV array listing or field labeling. PV conductors located inside the boundary or not more than 3 feet (1 m) from the point of penetration of the surface of the building shall be limited to not more than 80 volts within 30 seconds of rapid shutdown initiation. PV arrays with no exposed wiring methods, no exposed conductive parts, and installed more than 8 feet from exposed grounded conductive parts or ground shall not be required to comply with rule 2 above.

Figure 1:
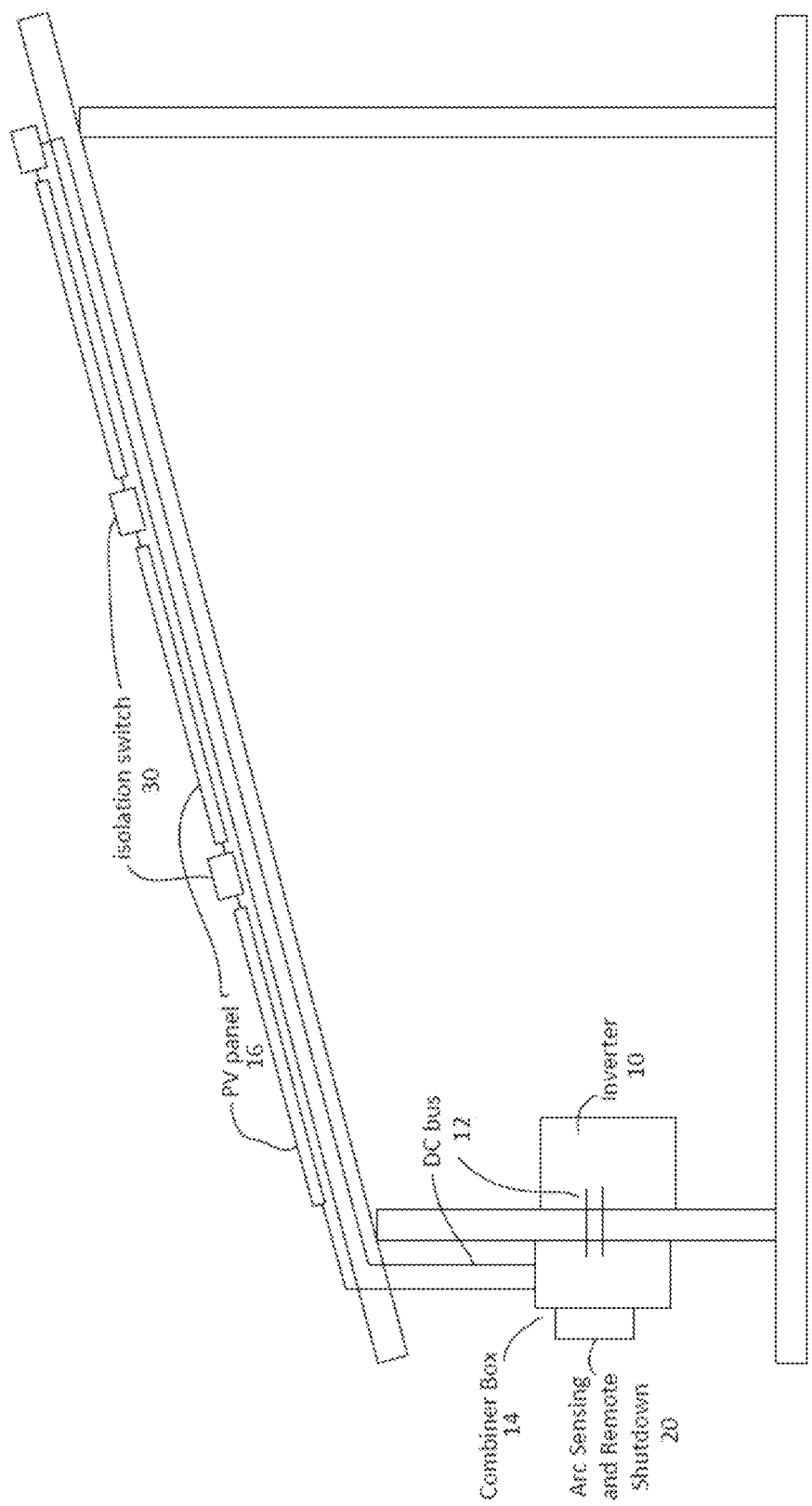
FIG. 1 is a schematic illustration of a building equipped with rooftop PV panels showing an outside remote shutdown control and an optional arc sensing control at the combiner box and an inside inverter connected to the PV panels by a DC bus with isolation switches at the PV panels.

In one example, the rapid shutdown system can be applied to PV rooftop installations in a building as schematically illustrated in FIG. 1. In some configurations, an inverter 10 can be located inside the building for converting DC power from a power bus 12 of the PV panels 16. The PV panels 16 are installed as a string configuration 18 on a rooftop exposed to the sun. It will be appreciated that when DC storage of PV energy is desired, the unit 10 can comprise a battery charger.

In one embodiment of the present disclosure, a remote shutdown controller 20 is provided, and as illustrated it may be located on an outside wall of the building. A combiner box 14, may be the location where the PV Strings 18 are connected.

It will be appreciated that in some examples the actuation of the remote shutdown 20 can be under the control of the inverter 10 as well. FIG. 1 also illustrates schematically that isolation switches 30 are provided in the connection between panels 16 as part of the power bus 12. The isolation switches may be provided separately from panels 16 or they may be integrated into panels 16. An isolation switch may be provided with each panel 16, or they may be distributed within the array of panels 16, keeping in mind that the objective of the isolation switches 30 is to maintain the voltage present on the DC bus 12 below a given threshold when a shutdown is required.

Figure 2:
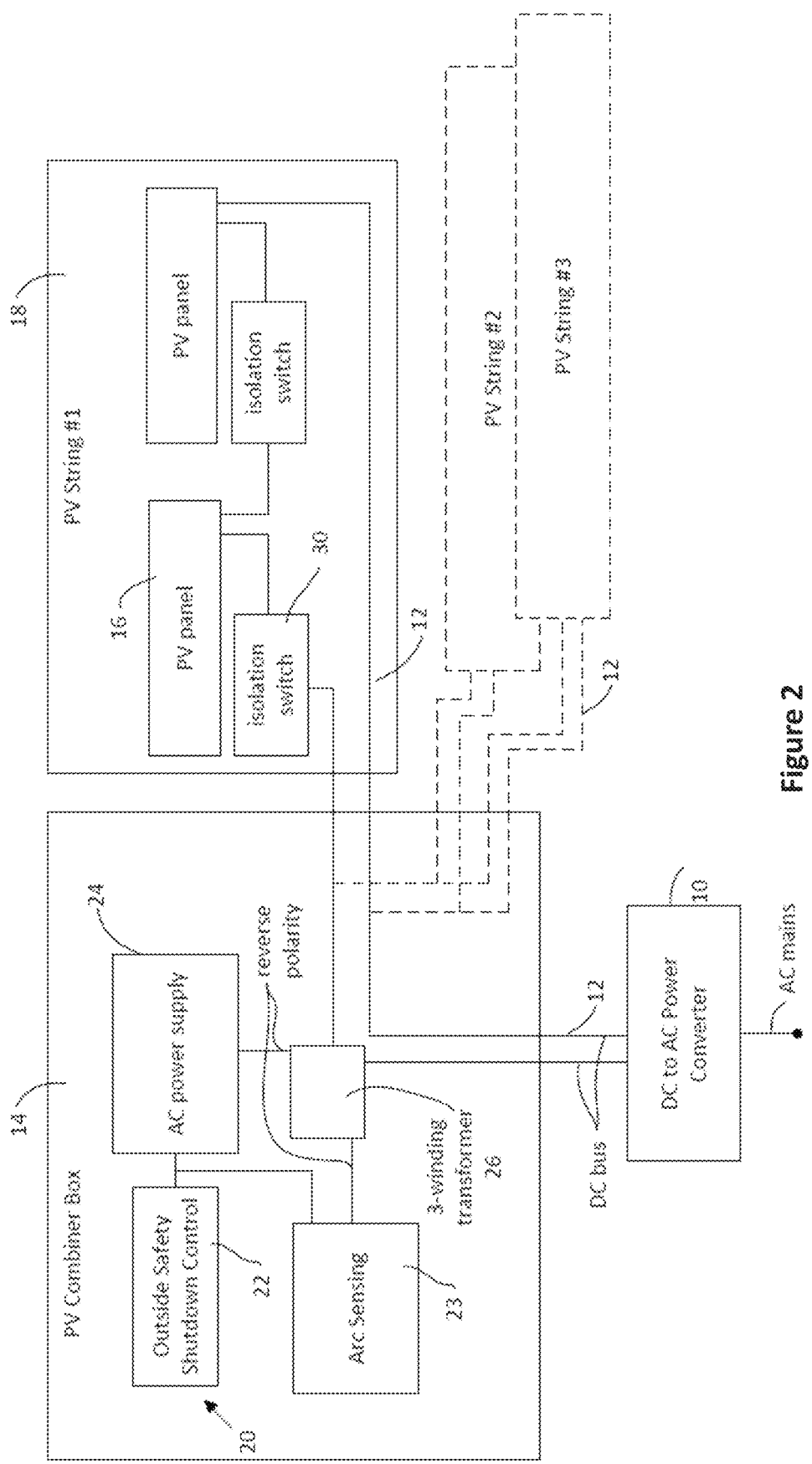
FIG. 2 is a schematic block diagram of the electrical system involved in the illustration of FIG. 1.

As illustrated in FIG. 2, the rapid shutdown system 20 that can an include arc sensing shutdown features can be built around a power supply 24 and multiple isolation devices 30 (for example, one per PV panel 16). The power supply 24 may or may not be coupled through an AC injector transformer 26.

The AC injector transformer can have three windings. A first winding of the transformer may be part of the resonance tank that the power supply 24 uses to generate alternative current. A second winding of the transformer may pass the full PV DC current while injecting the power on the array's DC line 12. A third winding having turns in the opposite direction than the direction of the turn of the first winding are connected to the arc sensing circuit 23. In this way, the injected AC signal is not seen by circuit 23 that will only see noise appearing on bus 12.

The arc sensing circuit is a circuit tuned to identify the signal characteristics caused by arcing and in response to such signal characteristics to output a control signal to the controller 22 to actuate the shutdown, for example by actuating the isolation switches 30.

The power supply 24 may have an operating frequency chosen to optimize the transmission across the PV array. From simulation and testing as well as a literature review, PV panels 16 appear to have a particular impedance. The system disclosed takes advantage of the PV's impedance and the PV's quality factor to minimize the injected power losses at the PV cell. From lab experiments, it has been noted that a frequency between 200 kHz and 300 kHz offers a high-quality factor (low energy dissipation) and a linear (predictable) impedance while being below the AM frequency band. It has been found that at 250 kHz, only 20 Vrms and 40 mA of alternative current is enough to supply all the isolation devices across a PV array with cable length of 80 meters. Thus, the experimental system demonstrated approximately a power consumption of 10 mW per meter of cable length in the PV array (a power consumption less than 20 mW per meter of cable length in the PV array is desirable). Using a frequency below 200 kHz increases power consumption, and therefore is it best not to use a frequency below 100 kHz. Using a frequency above 300 kHz is possible, however, above 440 kHz is too close to the AM band at 540 kHz to be suitable.

Figure 3:
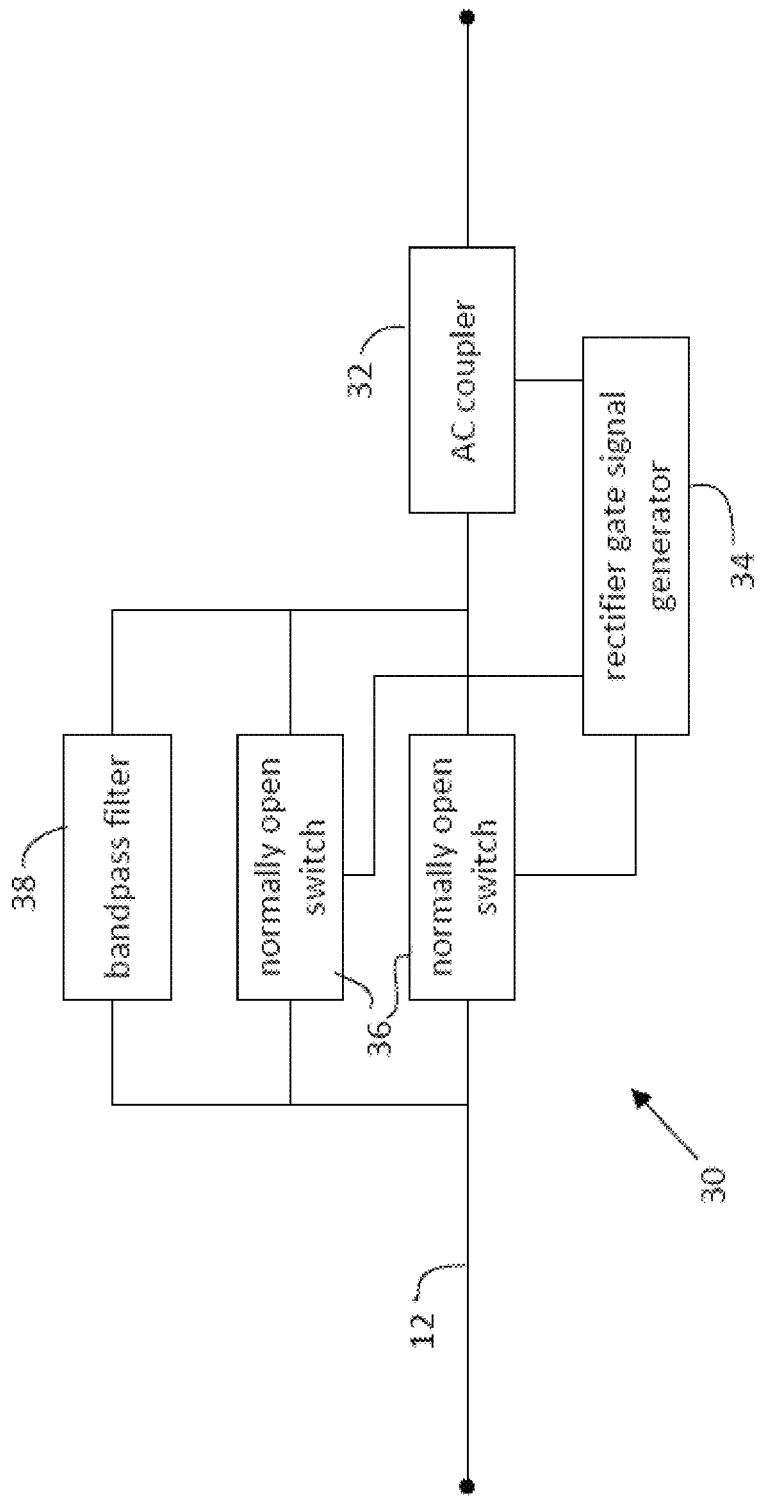
FIG. 3 is a schematic diagram of the isolation switch involved in the illustrations of FIGS. 1 and 2.

As illustrated in FIG. 3, the isolation device 30 is built around a coil coupler or transformer 32 that picks up the supplied alternative current on DC bus 12 and uses a rectifier circuit 34 to supply the gates of switching devices 36. While the AC power provided to bus 12 is extracted using a transformer coil 32, it will be appreciated that equivalent capacitor coupling can be used to extract the required power. Two normally-open switches are illustrated, and the use of two switches 36 provides redundancy in case one switch would fail and also reduces a current load through each one of the switches 36. It will be appreciated that more than two switches or a single switch 36 could be used. A bandpass filter 32, for example an ac coupling capacitor makes sure that the alternative current can always flow no matter the state of the high voltage switches. The filter 38 can be tuned to allow the AC current at the chosen supply frequency to pass, for example, between 200 kHz and 300 kHz. When the picked-up voltage is above a given threshold it energizes the semiconductor switches 36 that will let the PV energy flow to the load. As soon as the isolation device loses it supply, the rectifier circuit 34 stops supplying the gate signal and the switches 36 reverts to an open state making the PV array inert and the whole system safe to touch. Circuit 34 preferably contains capacitors and the time for the gate signals to open switches 36 can be a number of seconds.

In some embodiments, the arc sensor may include an oscilloscope with large memory, high sampling rate and high bandwidth probe. The oscilloscope receives real arc signal and uses Local Mean Decomposition (LMD) and Empirical Mode Decomposition (EMD) to detect an arc within the system. An arc typically generating a wide frequency spectrum, but the arc signal may also contain some harmonics of the natural resonance frequency of the system. The method therefore seeks to find a "beat" at resonance frequency in order to detect the arc.

In some examples of the method, in order to detect the beat at resonance frequency of the system, the raw signal is passed through a Thresholded LMD and in parallel through a Windowed LMD. The threshold LMD allows us to prevent false triggering on small noise which may be a part of the harmonics associated with the natural resonance frequency of the system. In contrast 'large' noise would pass through this filter as dur to the nature of the arc, a large noise is a part of the signature that we want to detect. The Windowed LMD prevent errors in detecting arcs by preventing the arc detection system from being triggered by very fast events as typically fast transient events are not the beat that we are looking for. Upon completing the Windowed LMDs, the output signal of the filtering would be used to reconstruct the signal from the peaks found and to find the envelopes of the signal. After finding both envelope of the signal, they are compared and if the corroborate then we have detected an arc. The system then needs to blank and use a leaky integrator to make sure it does not trigger too fast.

Figure 4:
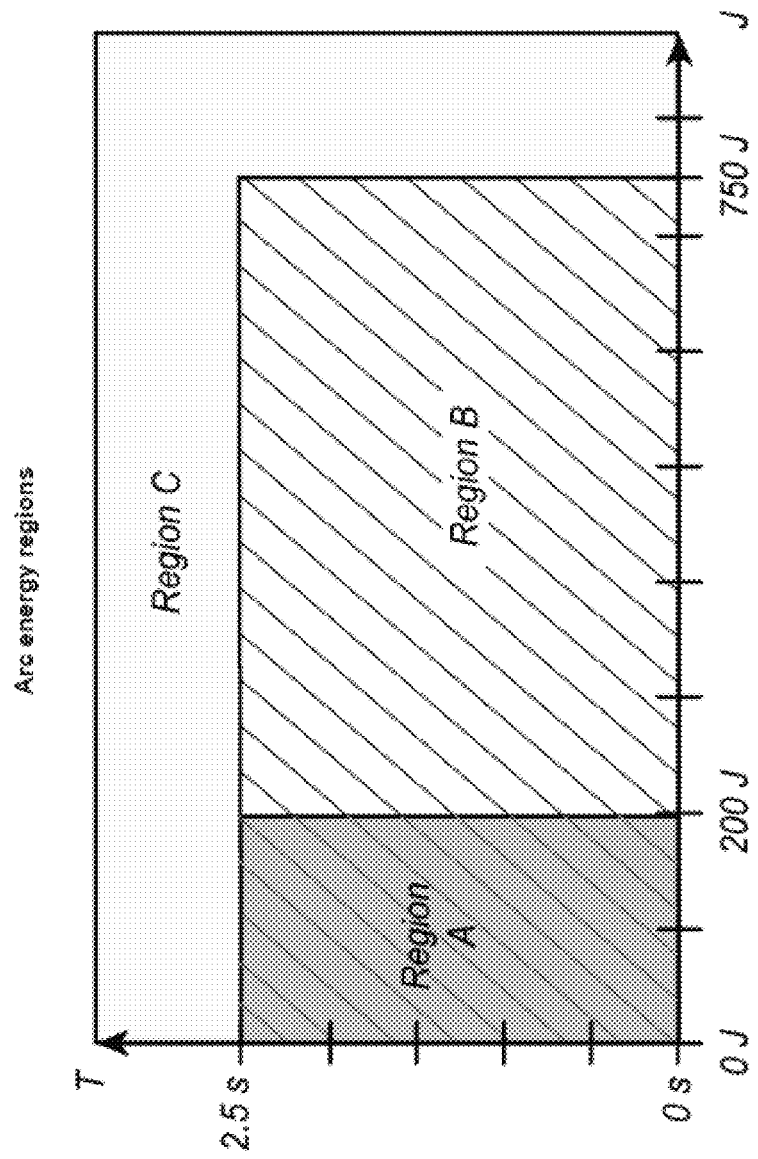
FIG. 4 shows the regions that an arc-fault circuit-interrupter should be capable of detecting or interrupting arcing based on UL699 standard

FIG. 4 shows the regions that an arc-fault circuit-interrupter should be capable of detecting or interrupting arcing based on UL699 standard. Region A as illustrated: For all tests, disrupt arcing event in less than 2.5 seconds, and limit energy not to exceed 200 J; Region B: For all tests, disrupt arcing event in less than 2.5 seconds, and limit energy not to exceed 750 J; and Region C: For any test, arcing time equal to or greater than 2.5 seconds, or energy greater than 750 J, the device is considered non-compliant with the standard.

It will be appreciated by those skilled in the art that in this application envelope of a signal refers to the "contour" of a waveform; "threshold LMD" is a signal processing method based on the LMD that uses a predefined deadband, hysteresis or a threshold to search for the signal of interest; and "windowed LIVID" is a signal processing method based on the LMD that uses a sliding window to search for the signal of interest.

Figure 5:
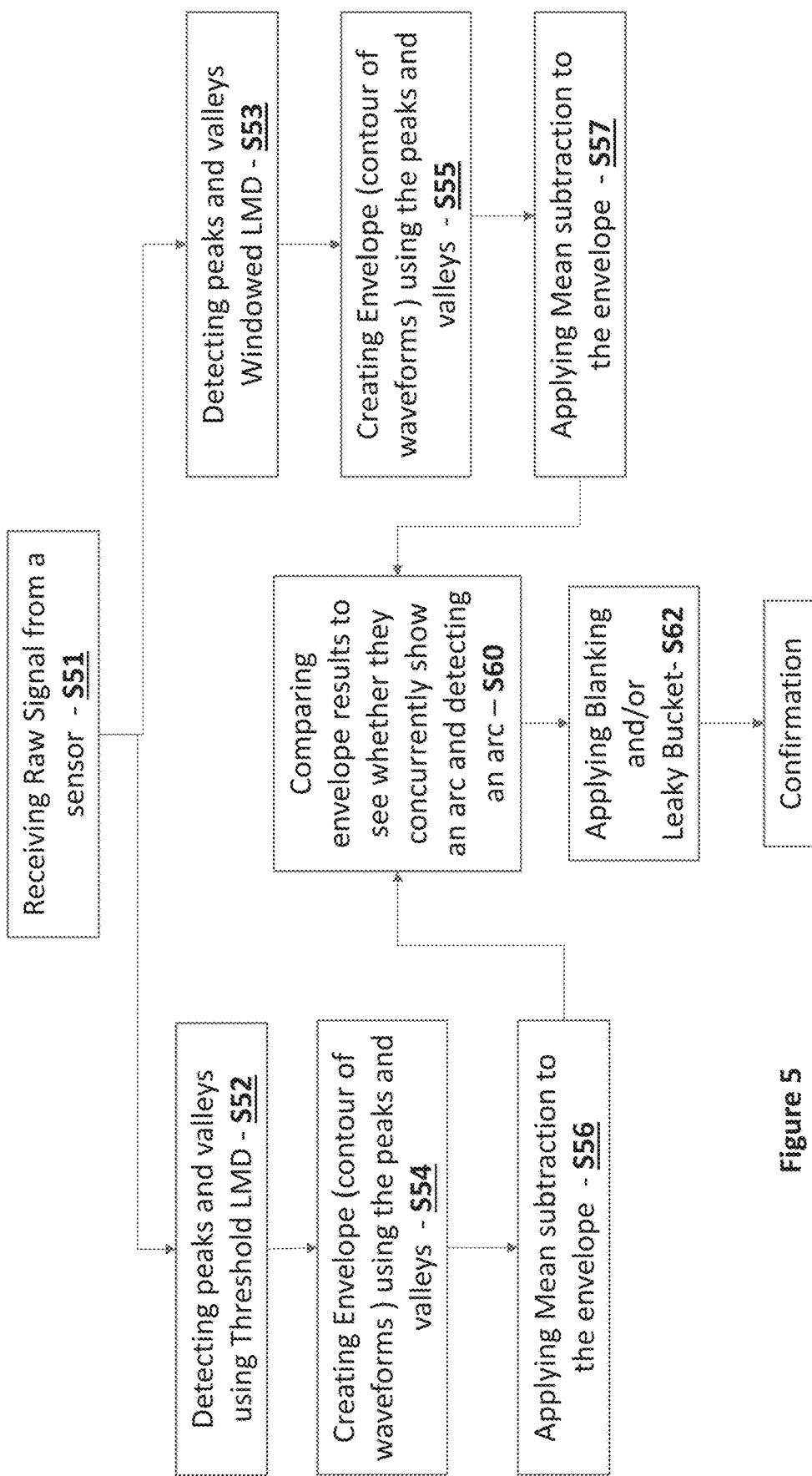
FIG. 5 is a flowchart of the steps included in the method used for detecting an arc in accordance with one embodiment of the present disclosure

Referring to FIG. 5, a flowchart for sensing an arc using the raw signal in a photovoltaic system is illustrated. S51 is the receiving Raw Signal from a sensor connected to a DC bus of the photovoltaic system collecting raw signal from the DC bus. It will be appreciated that the sensor does not have to be connected and can be in proximity of DC bus. For example, the sensor can benefit from galvanic isolation but still provide voltage or current signal. In S52 the method includes applying threshold Local Mean Decomposition (LMD) to extract a first set of peaks and valleys from the raw signal. S54 includes finding wave envelopes using the first set of peaks and valleys. At S56 the method may include applying mean subtraction method to the signal. S53 includes applying Windowed Local Mean Decomposition (LMD) to extract the peaks and valleys of the signal followed by finding envelopes using these peaks and valleys at S55. At S57 the method may include applying mean subtraction method to the envelopes. Then at S60 the two envelopes found in steps S55 and S54 are compared and the system may send an output signal indicating arcing if the envelopes concurrently shown an arc in the system. The method may also include applying Blanking and/or Leaky Bucket at S62.

Figure 6:
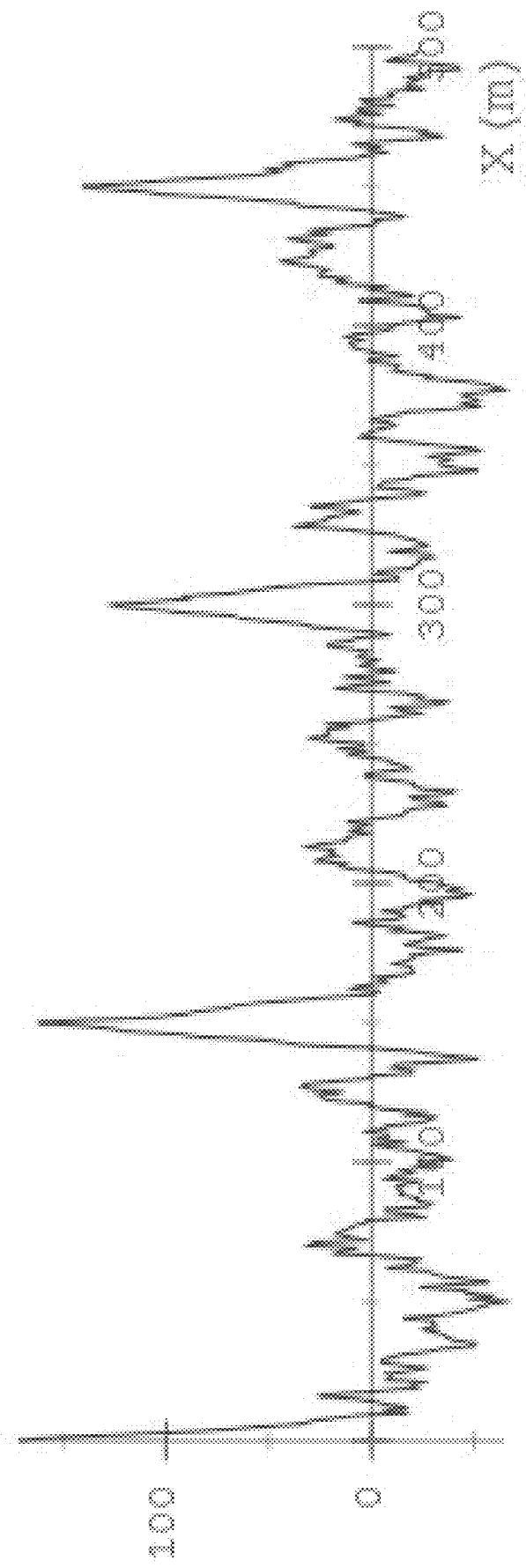
FIG. 6 is a schematic illustration of the Raw Signal Received by the processor for performing Threshold LMD.
Figure 7:
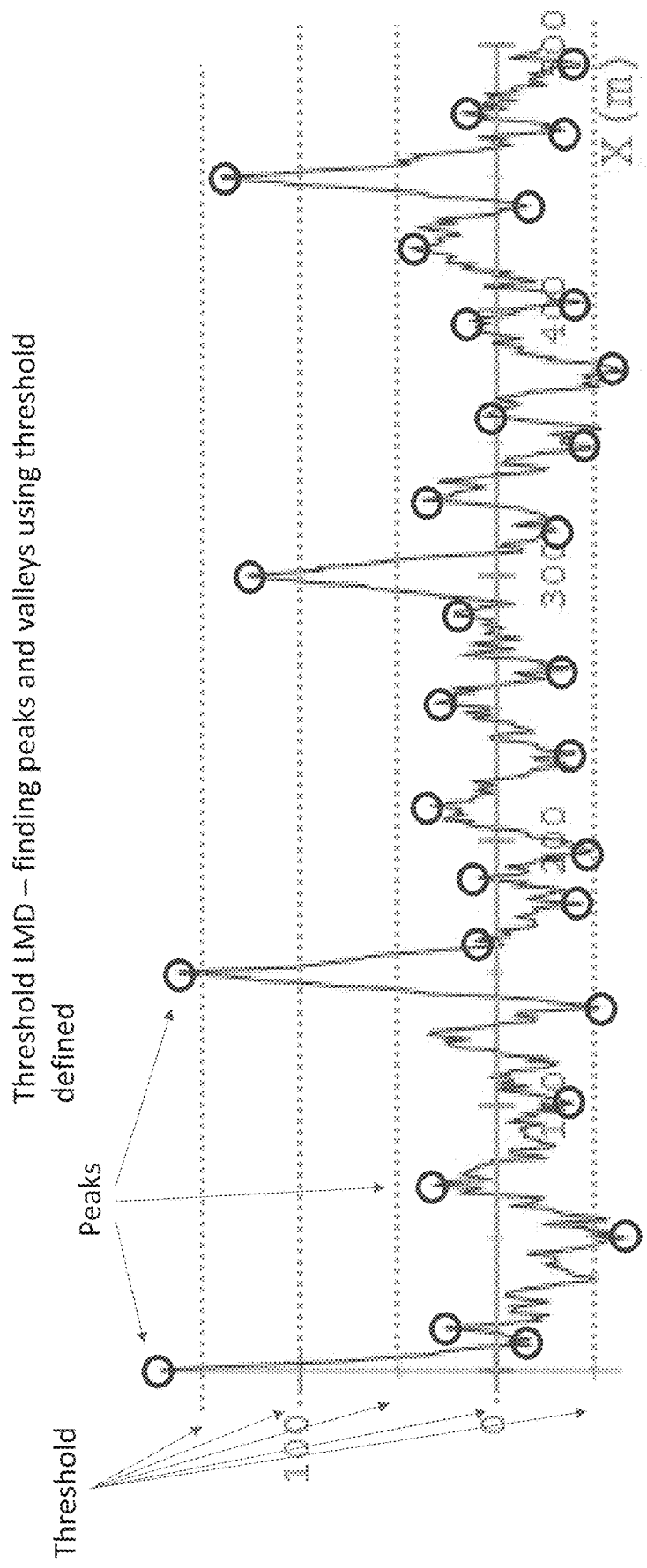
FIG. 7 is a schematic illustration of finding peaks and valleys of the raw signal shown in FIG. 6 using Threshold LMD method in accordance with one embodiment of the present disclosure.
Figure 8:
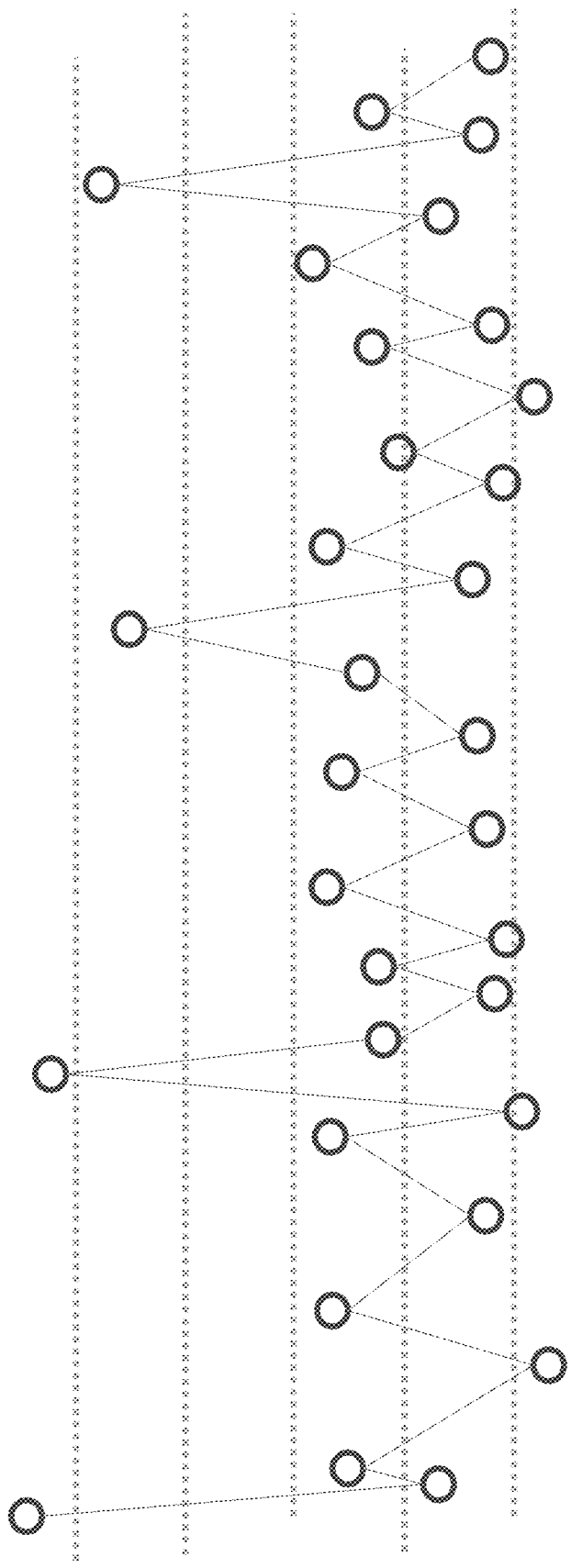
FIG. 8 is a schematic illustration of reconstruction the signal using peaks and valleys (shown in FIG. 7) using Threshold LMD method in accordance with one embodiment of the present disclosure.
Figure 9:
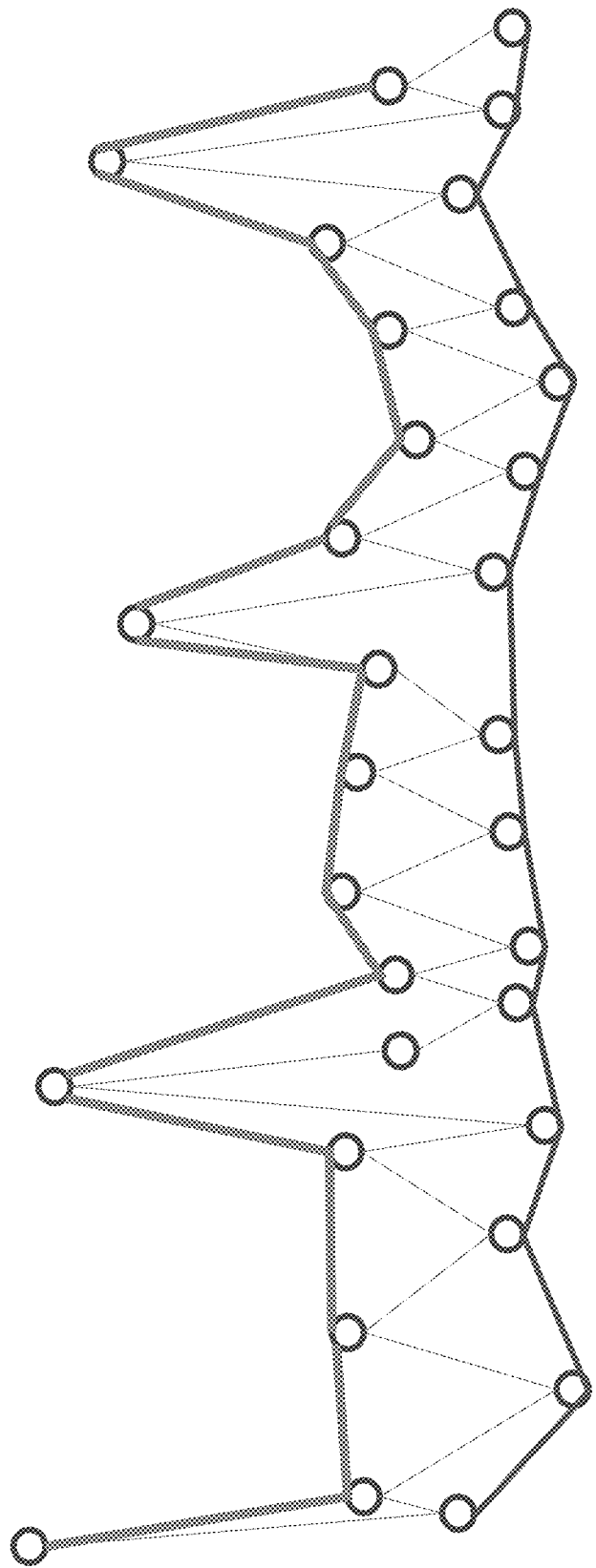
FIG. 9 is a schematic illustration of finding reconstructed signal (shown in FIG. 8) envelopes in Threshold LMD method in accordance with one embodiment of the present disclosure.

FIGS. 6 to 15 are illustrations showing the signal in each step of the process as described in FIG. 5. FIG. 6 is a schematic illustration of the Raw Signal Received by the processor from our sensor. FIG. 7 shows finding of peaks and valleys of the signal received from the sensor using Threshold LMD method. FIG. 8 shows the reconstruction the signal using peaks and valleys shown in FIG. 7 as done in Threshold LMD. In FIG. 9 the reconstructed signal is used to find envelopes (contours of the waveform).

Figure 10:
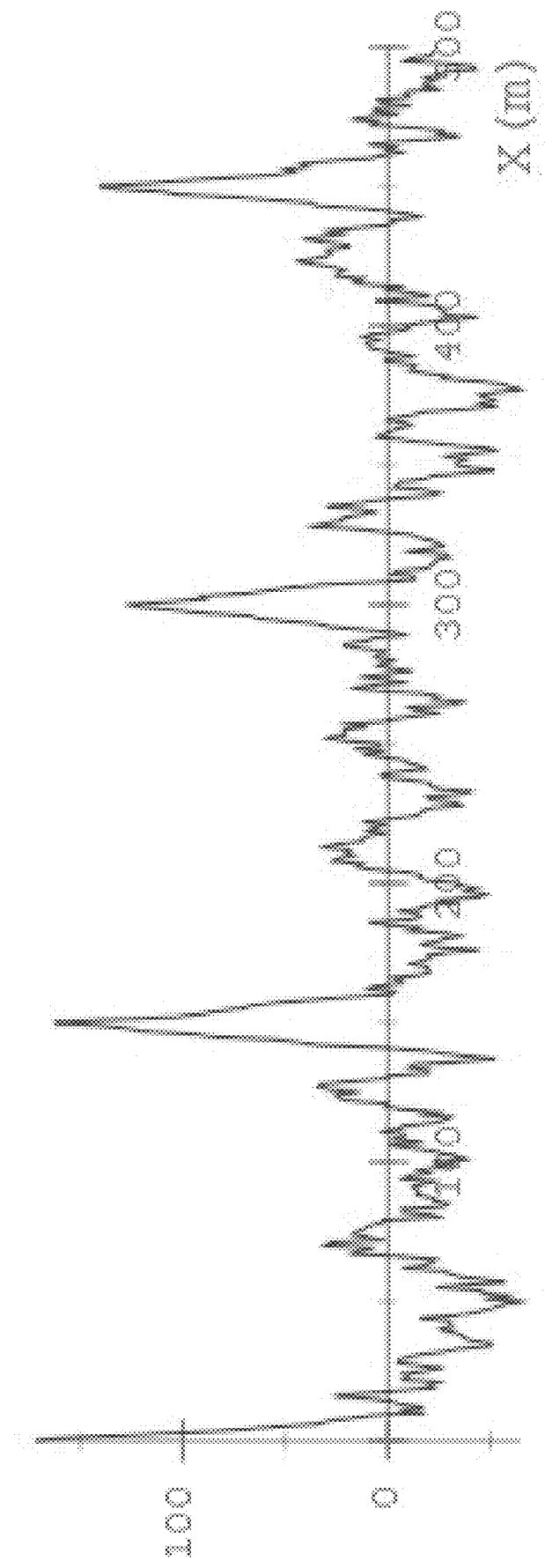
FIG. 10 is a schematic illustration of the Raw Signal Received (also shown in FIG. 6) by the processor for performing Threshold LMD.
Figure 11:
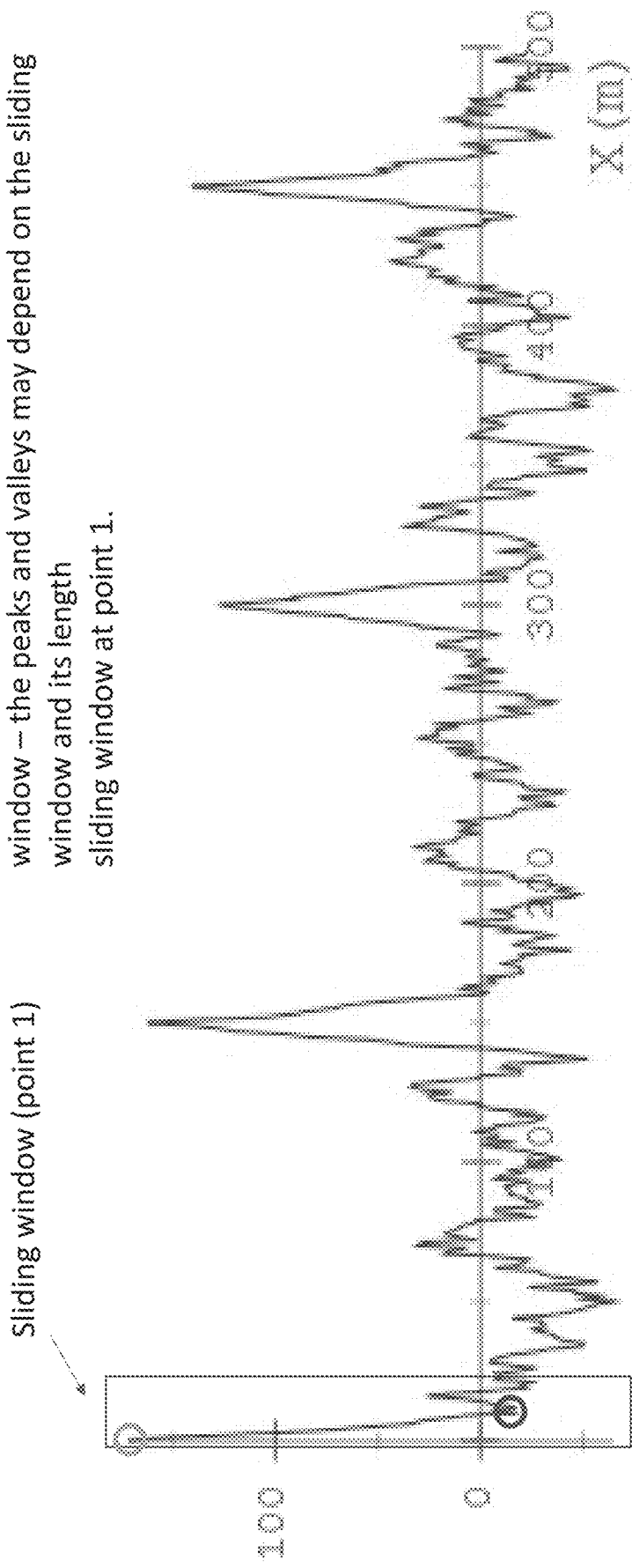
FIG. 11 is a schematic illustration finding peaks and valleys within a sliding window at point 1 using Windowed LMD method in accordance with one embodiment of the present disclosure.
Figure 12:
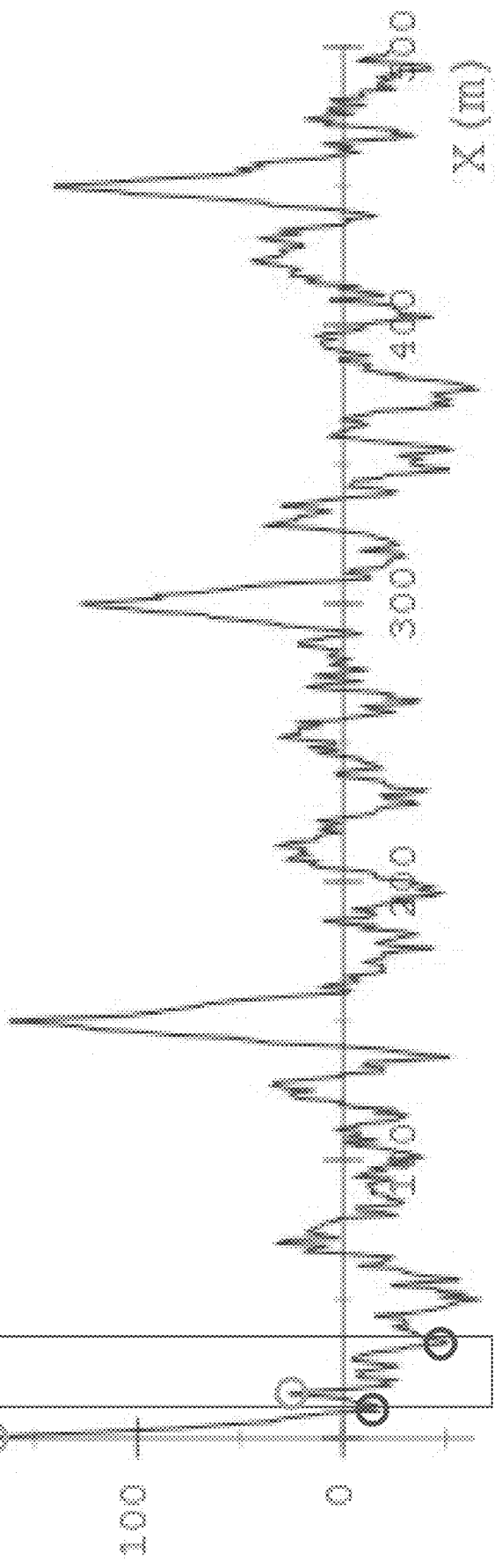
FIG. 12 is a schematic illustration finding peaks and valleys within the sliding window shown in FIG. 11 when it is at point 2.
Figure 13:
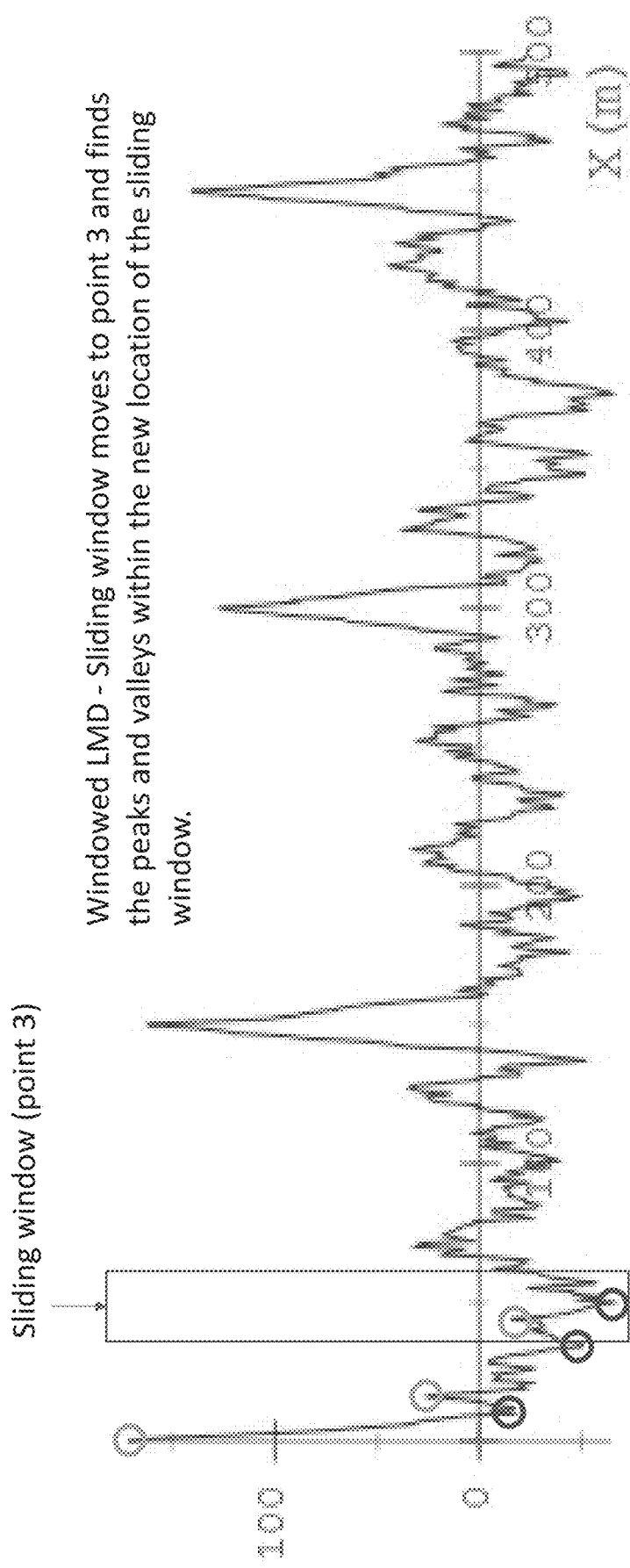
FIG. 13 is a schematic illustration finding peaks and valleys within the sliding window shown in FIG. 11 when it is at point 3.
Figure 14:
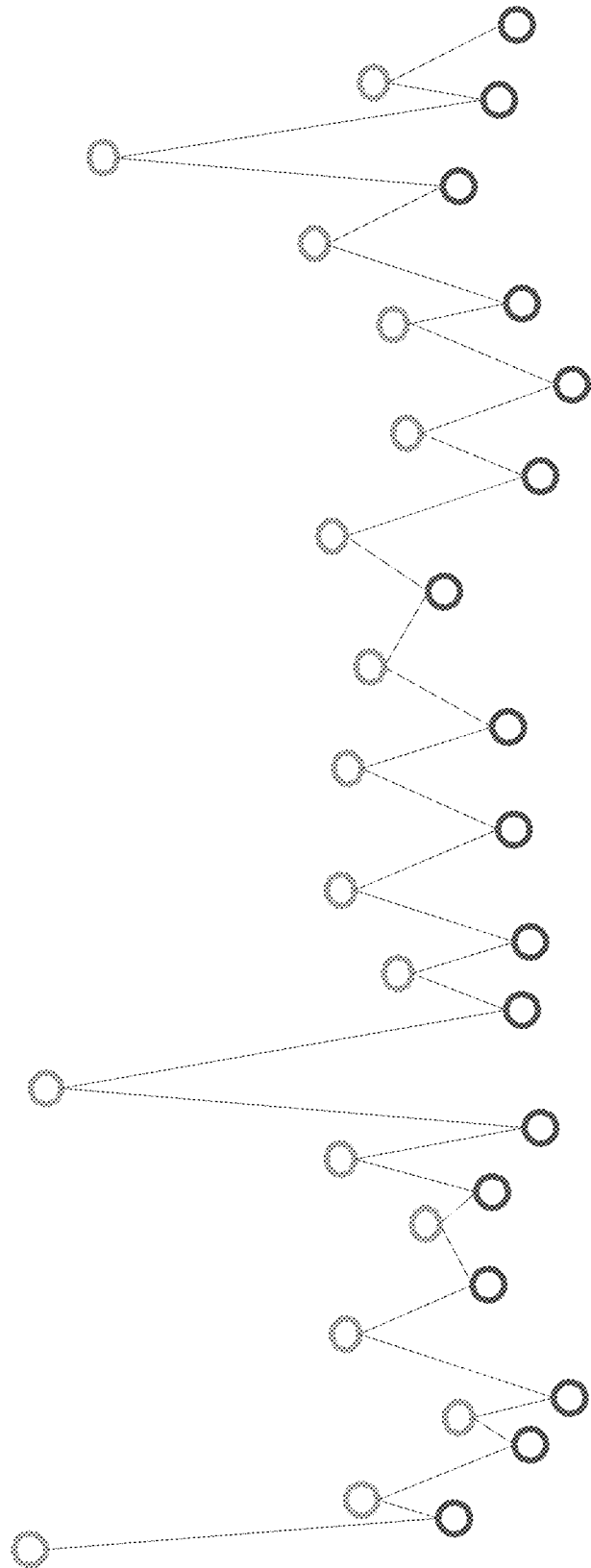
FIG. 14 is a schematic illustration of reconstruction the signal using peaks and valleys (shown in FIG. 13) using windowed LMD method in accordance with one embodiment of the present disclosure.
Figure 15:
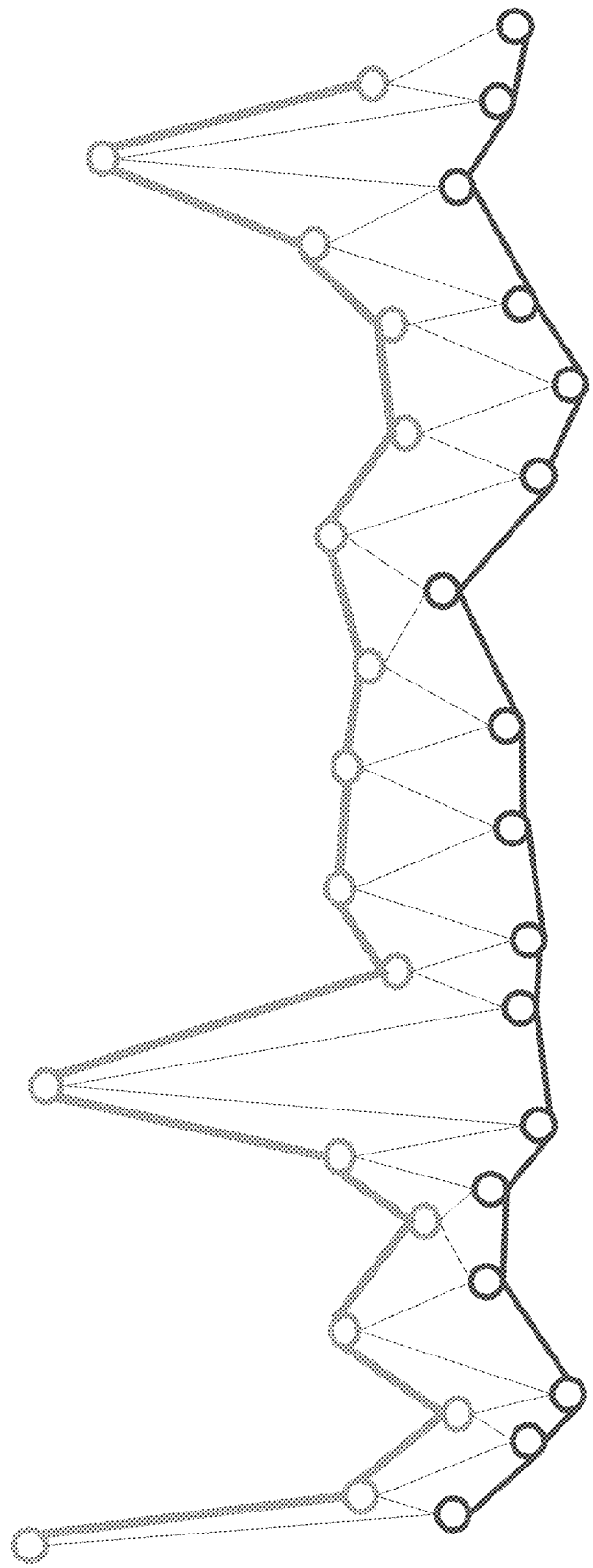
FIG. 15 is a schematic illustration of finding the envelopes of the reconstructed signal of FIG. 14 using windowed LMD method in accordance with one embodiment of the present disclosure.
Figure 16:
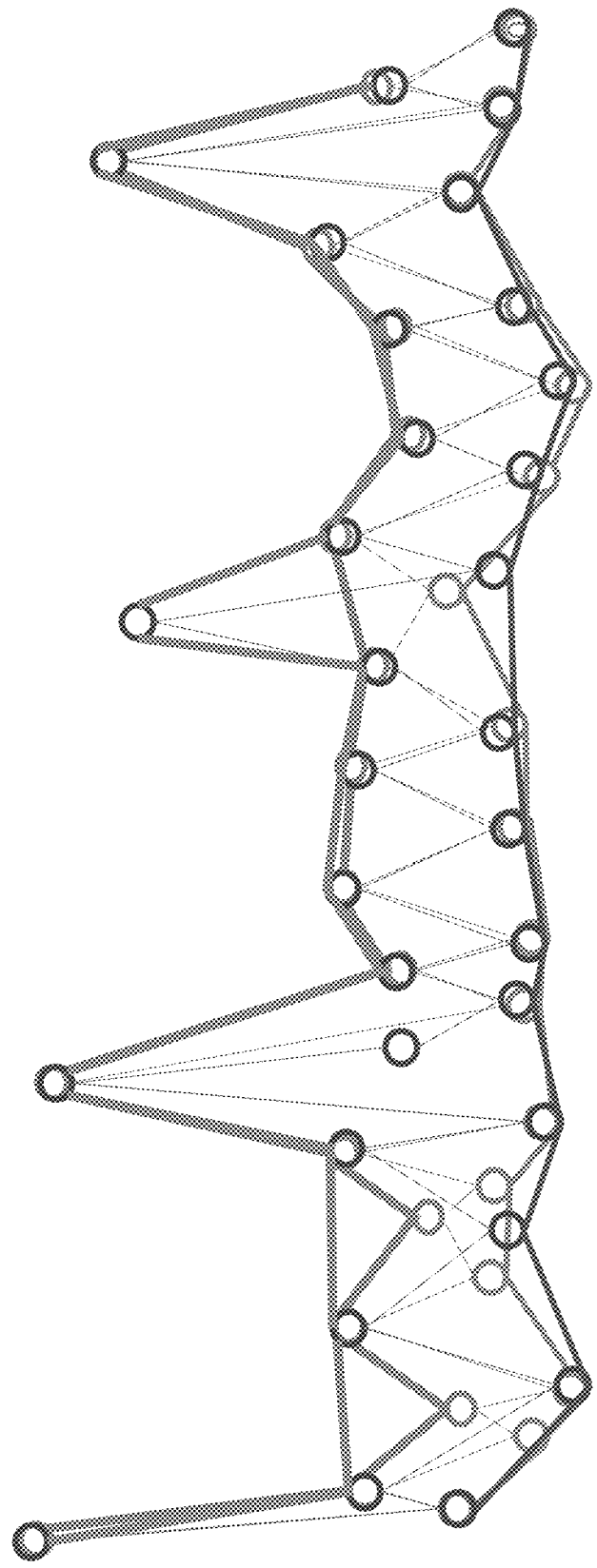
FIG. 16 shows the comparison and overlapping of the envelopes found using threshold LMD and windowed LMD for concurrent conclusion of arc presence.

FIG. 10 is a schematic illustration of the Raw Signal Received windowed LMD. FIGS. 11 to 13 illustrate finding of peaks and valleys within a sliding window at points 1 to 2 as done in the Windowed LMD method. FIG. 14 is a schematic illustration of reconstruction of the signal using peaks and valleys as done in windowed LMD method followed by the finding of the envelopes of the reconstructed signal in FIG. 15. Lastly, FIG. 16 shows the comparison and overlapping of the envelopes found using threshold LMD and windowed LMD during which a concurrent conclusion of arc presence can result in a conclusion that the arc is happening.

What is claimed is:

1. A method for arc detection in a photovoltaic system, the method comprising:
    collecting a raw signal by a sensor connected to a DC bus of said photovoltaic system;
    applying threshold Local Mean Decomposition (LMD) to extract a first set of peaks and valleys from said raw signal;
    finding a first set of envelopes using said first set of peaks and valleys;
    applying Windowed Local Mean Decomposition (LMD) to extract a second set of peaks and valleys;
    finding a second set of envelopes using said second set of peaks and valleys;
    comparing said first set of envelopes and said second set of envelopes;
    sending an output signal indicating arcing when said first set of envelopes and said second set of envelopes concurrently shows an arc in said system.

2. The method in claim 1, wherein said sending an output indicating arcing when said first set of envelopes and said second set of envelopes concurrently shown an arc in said system comprises applying blanking method to said first set of envelopes and said second set of envelopes.

3. The method in claim 1, wherein said sending an output indicating arcing when said first set of envelopes and said second set of envelopes concurrently shown an arc in said system comprises applying leaky bucket method to said first set of envelopes and said second set of envelopes.

4. The method in claim 1, further comprising applying mean subtraction to said first set of envelopes and said second set of envelopes.

5. The method in claim 1, further comprising shutting down said photovoltaic system upon sending said output signal indicating arcing.

6. An arc-sensing circuit for use with a photovoltaic system comprising:
    a sensor connected to a DC bus of said photovoltaic system collecting raw signal from said DC bus;
    a control unit receiving said raw signal comprising:
        a processor; and
        a non-transitory computer-readable medium containing instructions that, when executed by the processor, causes the processor to perform:
            applying threshold Local Mean Decomposition (LMD) to extract a first set of peaks and valleys from said raw signal;
            finding a first set of envelopes using said first set of peaks and valleys;
            applying Windowed Local Mean Decomposition (LMD) to extract a second set of peaks and valleys;
            finding a second set of envelopes using said second set of peaks and valleys;
            comparing said first set of envelopes and said second set of envelopes;
            sending an output signal indicating arcing when said first set of envelopes and said second set of envelopes concurrently shown an arc in said system.

7. The arc-sensing circuit in claim 6, wherein said non-transitory computer-readable medium further contain instructions that, when executed by the processor, causes the processor to perform:
    said sending an output indicating arcing when said first set of envelopes and said second set of envelopes concurrently shown an arc in said system comprises applying blanking method to said first set of envelopes and said second set of envelopes.

8. The arc-sensing circuit in claim 6, wherein said non-transitory computer-readable medium further contain instructions that, when executed by the processor, causes the processor to perform:
    wherein said sending an output indicating arcing when said first set of envelopes and said second set of envelopes concurrently shown an arc in said system comprises applying leaky bucket method to said first set of envelopes and said second set of envelopes.

9. The arc-sensing circuit in claim 6, wherein said non-transitory computer-readable medium further contain instructions that, when executed by the processor, causes the processor to further perform:
    applying mean subtraction to said first set of envelopes and said second set of envelopes.

10. The arc-sensing circuit in claim 6, wherein said non-transitory computer-readable medium further contain instructions that, when executed by the processor, causes the processor to further perform:
    shutting down said photovoltaic system upon sending said output signal indicating arcing.

* * * * *